(12) United States Patent
Wallinger et al.

(10) Patent No.: US 12,333,272 B2
(45) Date of Patent: *Jun. 17, 2025

(54) POWER SEQUENCE SYNCHRONIZATION BETWEEN MULTIPLE DEVICES

(71) Applicant: Texas Instruments Incorporated, Dallas, TX (US)

(72) Inventors: Karl John Wallinger, Dallas, TX (US); Sunil Kashyap Venugopal, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/665,996

(22) Filed: May 16, 2024

(65) Prior Publication Data
US 2024/0303036 A1 Sep. 12, 2024

Related U.S. Application Data

(63) Continuation of application No. 17/537,997, filed on Nov. 30, 2021, now Pat. No. 12,019,487.

(51) Int. Cl.
| | |
|---|---|
| *H02M 1/00* | (2007.01) |
| *G06F 1/26* | (2006.01) |
| *G06F 7/501* | (2006.01) |
| *G06F 30/343* | (2020.01) |
| *H03K 19/17724* | (2020.01) |

(52) U.S. Cl.
CPC ............ *G06F 7/501* (2013.01); *G06F 30/343* (2020.01); *H03K 19/17724* (2013.01)

(58) Field of Classification Search
CPC .......... G06F 1/26; G06F 7/501; H02M 1/088; H02M 1/0003
See application file for complete search history.

(56) References Cited

U.S. PATENT DOCUMENTS

| | | | |
|---|---|---|---|
| 8,607,036 B2 | 12/2013 | More | |
| 2004/0095081 A1* | 5/2004 | Kernahan | .......... H05B 41/3927 315/307 |
| 2004/0095108 A1* | 5/2004 | Kernahan | .......... H03K 19/0963 323/282 |
| 2011/0320835 A1 | 12/2011 | Browning | |

(Continued)

FOREIGN PATENT DOCUMENTS

| | | |
|---|---|---|
| CN | 111106743 A | 5/2020 |
| EP | 3391205 B1 | 6/2019 |
| JP | 2021093841 A | 7/2023 |

*Primary Examiner* — Sisay G Tiku
(74) *Attorney, Agent, or Firm* — Valerie M. Davis; Frank D. Cimino

(57) ABSTRACT

A power management circuit includes a status terminal, an open drain driver, a slot parameter memory, and a slot duration counter. The status terminal is adapted to be coupled to a different power management circuit. The open drain driver is coupled to the status terminal, and is configured to drive the status terminal. The slot parameter memory is configured to store slot parameter values. The slot duration counter is coupled to the slot parameter memory and the open drain driver. The slot duration counter is configured to time a slot duration based on a slot duration value stored in the slot parameter memory, and to activate the open drain driver responsive to expiration of the slot duration.

12 Claims, 5 Drawing Sheets

(56) References Cited

U.S. PATENT DOCUMENTS

| | | | |
|---|---|---|---|
| 2016/0028347 A1* | 1/2016 | Okamoto | H03B 5/24 |
| | | | 331/108 R |
| 2016/0232012 A1 | 8/2016 | Karimian-Kakolaki | |
| 2017/0255250 A1 | 9/2017 | Ngo | |
| 2019/0064910 A1 | 2/2019 | Wang | |
| 2021/0349519 A1* | 11/2021 | Aqrabawi | G06F 1/3296 |

* cited by examiner

POWER SEQUENCE SYNCHRONIZATION BETWEEN MULTIPLE DEVICES

CROSS-REFERENCE TO RELATED APPLICATIONS

This application is a continuation of U.S. patent application Ser. No. 17/537,997, filed Nov. 30, 2021, which is hereby incorporated herein by reference in its entirety.

BACKGROUND

Multiple power supply voltages may be needed to operate complex circuits, such as microprocessors or a system-on-chip (SoC). For example, one or more power supply voltages may be needed to power input/output circuits of the SoC, one or more power supply voltages may be needed to power digital circuits of the SoC, and one or more power supply voltages may be needed to power analog circuits of the SoC. The sequencing of the various power supply voltages should be controlled to ensure proper operation of the SoC.

SUMMARY

In one example, a power management circuit includes a status terminal, an open drain driver, a slot parameter memory, and a slot duration counter. The open drain driver includes an output and an input. The output is coupled to the status terminal. The slot duration counter includes an output, a first input, and a second input. The output is coupled to the input of the open drain driver. The first input of the slot duration counter is coupled to the slot parameter memory. The second input of the slot duration counter is coupled to the status terminal.

In another example, a power management circuit includes a status terminal, an open drain driver, a slot parameter memory, and a slot duration counter. The status terminal is adapted to be coupled to a different power management circuit. The open drain driver is coupled to the status terminal, and is configured to drive the status terminal. The slot parameter memory is configured to store slot parameter values. The slot duration counter is coupled to the slot parameter memory and the open drain driver. The slot duration counter is configured to time a slot duration based on a slot duration value stored in the slot parameter memory, and to activate the open drain driver responsive to expiration of the slot duration.

In a further example, a system includes a load circuit, a first power management circuit, and a second power management circuit. The first power management circuit includes a first voltage regulator, a first status terminal, and a first open drain driver. The first voltage regulator is coupled to the load circuit, and is configured to provide a first power supply voltage to the load circuit. The first open drain driver is coupled to the first status terminal, and is configured to drive the first status terminal. The second power management circuit includes a second voltage regulator, a second status terminal, an open drain driver, a slot parameter memory, and a slot duration counter. The second voltage regulator is coupled to the load circuit, and is configured to provide a second power supply voltage to the load circuit. The second status terminal is coupled to the first status terminal. The open drain driver is coupled to the second status terminal, and is configured to drive the second status terminal. The slot parameter memory is configured to store slot parameter values. The slot duration counter is coupled to the slot parameter memory and the open drain driver. The slot duration counter is configured to time a slot duration based on a slot duration value stored in the slot parameter memory, and to deactivate the second open drain driver responsive to expiration of the slot duration.

DETAILED DESCRIPTION

Figure 1:
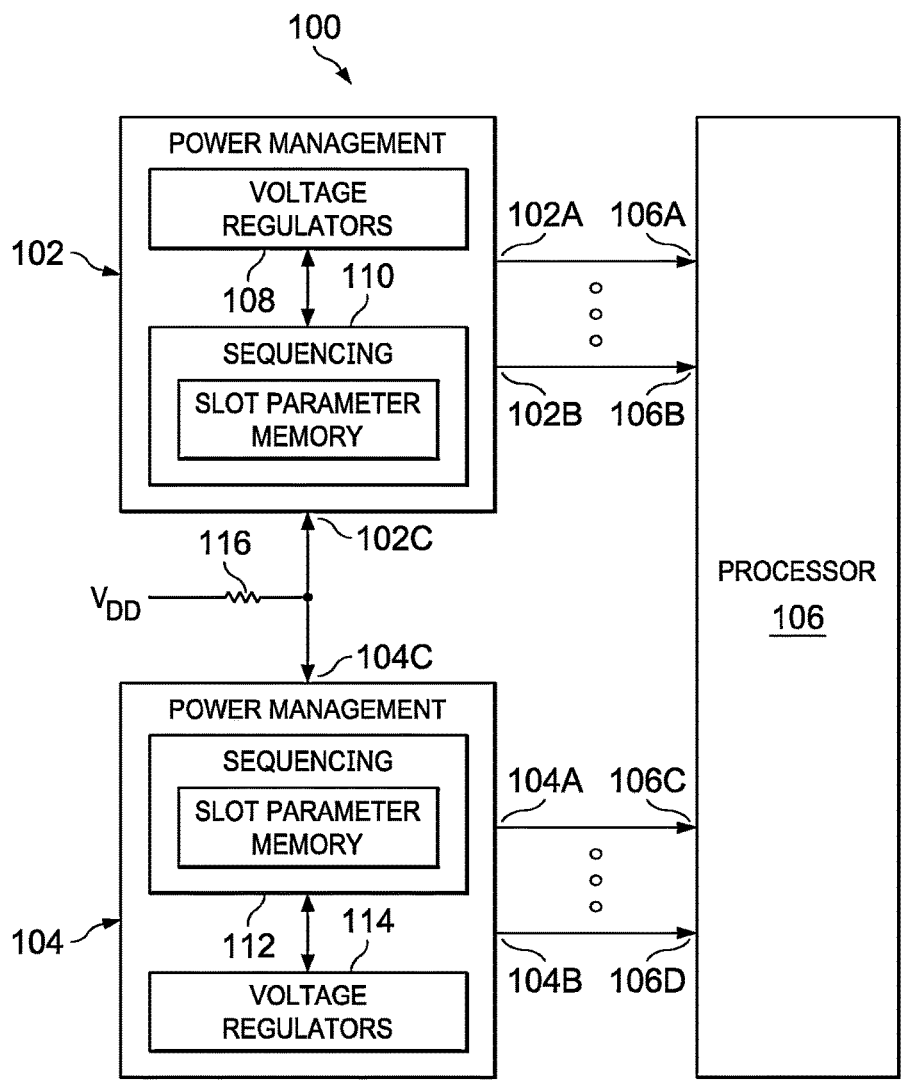
FIG. 1 is a block diagram for an example system that includes power management circuits with regulator sequencing.

Multiple power management circuits may be used to generate the power supply voltages used to power a complex circuit, such as a System-on-Chip (SoC) or a microprocessor. Each of the power management circuits controls only a subset (fewer than all) of the power supply voltages. When powering up the SoC, the sequencing of the power supply voltages must be controlled, across the multiple power management circuits, to ensure proper operation of the SoC. The power supply voltages should be enabled in a desired sequence, and each power supply voltage should be enabled only after any previously enabled power supply voltages have stabilized at a desired operating voltage. Similarly, the shutdown of the power supply voltages should be controlled, across the multiple power management circuits, to ensure proper operation of the SoC. The power supply voltages in the power sequence may be interleaved between the power management circuits. To provide such sequencing, each power management circuit should be aware of the status of the power supply voltages generated by other power management circuits throughout the power sequence.

The power management circuits disclosed in this description employ a single-wire communication interface and slot-based sequencing to communicate power supply voltage status information between the power management circuits. The single-wire communication interface utilizes an open drain driver on each power management circuit to synchronize the voltage regulator activation sequences of multiple power management circuits. The open drain drivers of all of the power management circuits are connected in a wired-OR configuration to form a common signaling line.

Within each power management circuit, sequencing is performed over a series of power sequence slots. Each voltage regulator in the power management circuit is configured (e.g., by parameters stored in non-volatile memory) to be on or off. If configured to on, the regulator is further configured, (by the stored parameters) to be enabled during a specified power sequence slot. The parameters also configure each sequence slot to have a specified time duration. Each power management circuit can configure 0, 1 or more regulators per power sequence slot.

At the beginning of each power sequence slot, all power management circuits pull the common signaling line low. At the same time, the power management circuits enable all of the regulators assigned to the current power sequence slot. Each power management circuit sets the common signaling line high only after the slot duration has expired, and all regulators enabled in the current power sequence slot have reached their target voltage. The dependency on output voltage can be omitted for rails which do not have voltage monitoring. A timeout is included, so if a power supply voltage does not reach the target voltage in some maximum time, the power-up sequence will be aborted. An important benefit of this methodology is that power-up faults in one power management circuit are automatically communicated to the other power management circuits during the course of the power-up procedure. If any power management circuit encounters an issue at any step of the sequence, the timeout communicates the fault to the other power management circuits.

Because the common signaling line is provided in a wired-OR configuration, it only goes high in a given power sequencing slot when the regulators assigned to the slot produce the target power supply voltages and the slot duration time has expired. When the common signaling line goes high, all power management circuits proceed to the next sequence step. Thus, the power management circuits provide synchronization and communication between the power management circuits throughout the power sequence, so that all the power management circuits are operating in concert with each other at each step in the sequence. The described operations are repeated until all power sequencing steps have been executed. This way, each power supply voltage of each power management circuit is sequenced with respect to any power supply voltage of the other power management circuits.

The same process is applied for power-down sequencing. At the beginning of each power sequencing slot, each power management circuit pulls the common signaling line low and disables all the regulators assigned to the current power sequencing slot. The common signaling line goes high after all regulators assigned to the current power sequencing slot have reached a sufficiently low voltage (e.g., 300 millivolts), and the slot duration time has expired.

FIG. 1 is a block diagram for an example system 100 that includes power management circuits with regulator sequencing. The system 100 includes a power management circuit 102, a power management circuit 104, and a processor 106 (a graphics processing unit, general purpose microprocessor, etc.). In some implementations of the system 100, the processor 106 may be replaced by a different load circuit (e.g., a field programmable gate array, a mixed signal application specific integrated circuit, a system-on-chip, or other load circuit that uses multiple power supply voltages). Some implementations of the system 100 may include more than two power management circuits coupled to the processor 106.

The power management circuit 102 includes voltage regulators 108 and a sequencing circuit 110. The voltage regulators 108 generate power supply voltages that power the processor 106. Outputs 102A through 102B of the power management circuit 102 are coupled to inputs 106A to 106B of the processor 106 for providing the power supply voltages generated by the power management circuit 102 to the processor 106. The voltage regulators 108 may include, but are not limited to, switching regulators (e.g., buck converters, boost converter, buck-boost converters) and/or linear regulators.

The power management circuit 104 is similar to the power management circuit 102, and includes voltage regulators 114 and a sequencing circuit 112. Outputs 104A through 104B of the power management circuit 104 are coupled to inputs 106C to 106D of the processor 106 for providing the power supply voltages generated by the power management circuit 104 to the processor 106. The voltage regulators 114 may include, but are not limited to, switching regulators and/or linear regulators.

The sequencing circuit 110 and the sequencing circuit 112 control the sequencing of the various voltage regulators included in the power management circuit 102 and the power management circuit 104. Proper operation of the processor 106 may require that the individual voltage regulators of the voltage regulators 108 and the voltage regulators 114 provide particular power supply voltages to the processor 106 in specified sequence. For example, at power up of the system 100, a first voltage regulator of the voltage regulators 108 provides a first power supply voltage to the processor 106 before a first voltage regulator of the voltage regulators 114 provides a second power supply voltage to the processor 106, etc. The power management circuit 102 includes a status terminal 102C that is coupled, via a single conductor, to a status terminal 104C of the power management circuit 104 for communication of power sequence status information. The sequencing circuit 110 includes an open drain driver to drive the status terminal 102C, and control circuitry to manage the sequential activation of the various voltage regulators of the voltage regulators 108. The sequencing circuit 112 may be similar or identical to the sequencing circuit 110. The sequencing circuit 110 and the sequencing circuit 112 enable each voltage regulator of the voltage regulators 108 and the voltage regulators 114 in a predefined sequence over a number of time slots (sequence slots). At the start of a time slot, the sequencing circuit 110 and the sequencing circuit 112 activate the open drain drivers to pull the voltage at the status terminal 102C and the status terminal 104C low. At the end of the time slot, the sequencing circuit 110 and the sequencing circuit 112 deactivate the open drain drivers (provided that a voltage regulator enabled in the slot has reached a predetermined output voltage) to allow the voltage at the status terminal 102C and the status terminal 104C to rise via the resistor 116.

The sequencing circuit 110 and the sequencing circuit 112 include a non-volatile memory (slot parameter memory) that stores information for controlling the sequencing of the voltage regulators. Information stored in the non-volatile memory may include: the duration of each slot, and identification of one or more voltage regulators assigned to each slot. The non-volatile memory may contain different information for sequencing power up and power down. That is, the sequence of voltage regulator activation for powering up the system 100 may be different from the sequence of voltage regulator deactivation for powering down the system 100.

Figure 2:
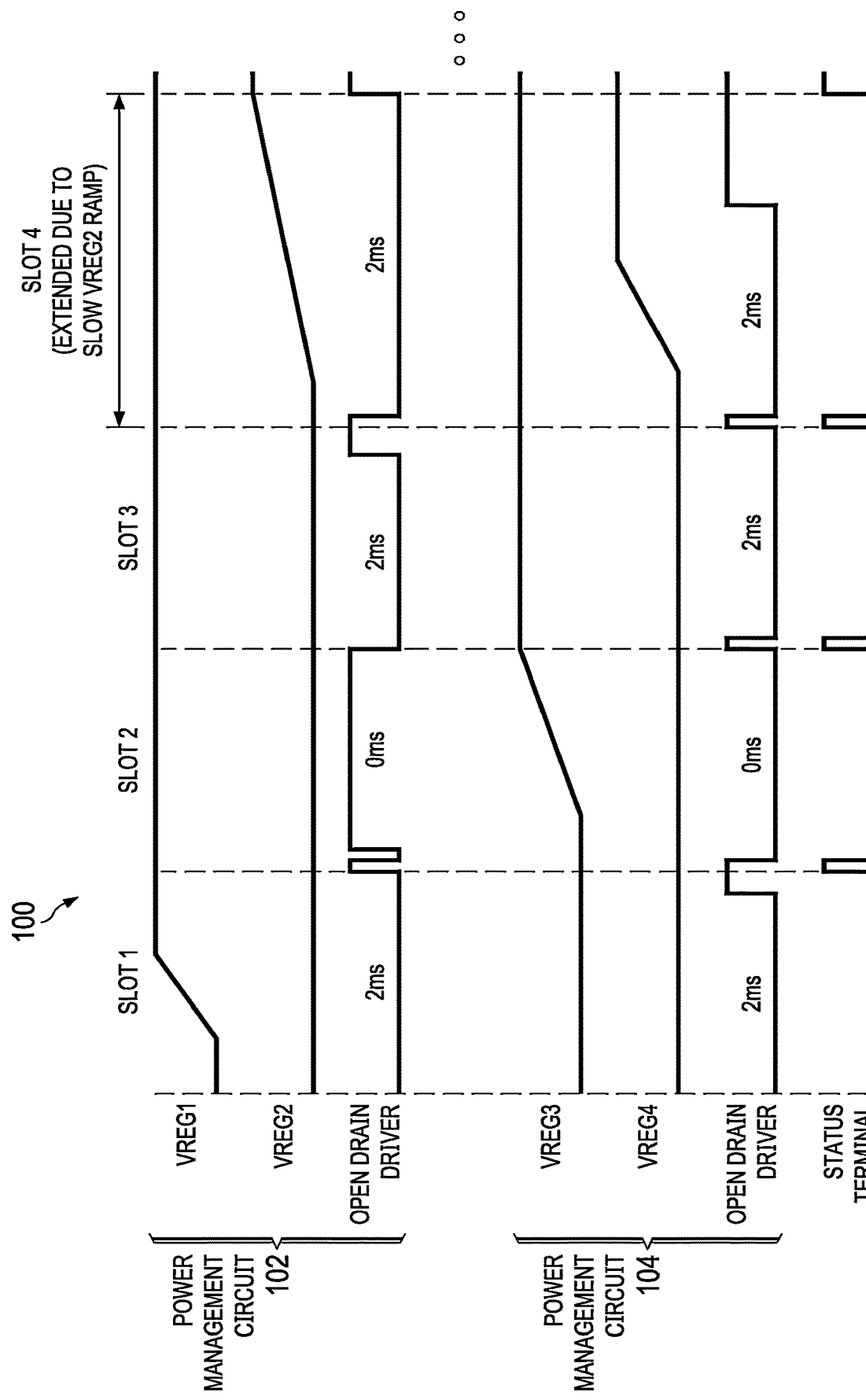
FIG. 2 shows an example of voltage regulator sequencing in the system of FIG. 1.

FIG. 2 shows an example of voltage regulator sequencing in the system 100. FIG. 2 illustrates activation of four voltage regulators using four slots. Two of the four voltage regulators are provided in each of the power management circuit 102 and the power management circuit 104. The sequencing circuit 110 and the sequencing circuit 112 may provide for activation of any number of voltage regulators using any number of slots (e.g., 16 voltages regulators using 16 slots). In FIG. 2, at the start of SLOT 1, the sequencing circuit 110 and the sequencing circuit 112 activate their respective open drain drivers to pull the status terminal 102C and status terminal 104C low. A first voltage regulator of the voltage regulators 108 is enabled in SLOT 1, and the power supply voltage (VREG1) increases to a predetermined voltage before the time of SLOT 1 expires. SLOT 1 is assigned a duration of 2 milliseconds in FIG. 2. The sequencing circuit 110 and the sequencing circuit 112 time SLOT 1 independently. At the expiration of SLOT 1, the sequencing circuit 110 and the sequencing circuit 112 deactivate their respective open drain drivers to allow the status terminal 102C and status terminal 104C to go high. When the status terminal 102C and the status terminal 104C go high, the sequencing circuit 110 and the sequencing circuit 112 initiate SLOT 2.

SLOT 2 is assigned a duration of 0 milliseconds. Because of the 0-millisecond slot duration, the open drain driver of the sequencing circuit 110 is disabled at the start of SLOT 2. A first voltage regulator of the voltage regulators 114 is enabled in SLOT 2, and the power supply voltage (VREG3) increases to a predetermined voltage after the time assigned to SLOT 2 expires, but before the SLOT 2 timeout expires. The open drain driver of the sequencing circuit 112 is activated at the start of the SLOT2 and remains active until the power supply voltage (VREG3) increases to a predetermined voltage. When the VREG3 reaches the predetermined voltage, the sequencing circuit 112 deactivates its open drain driver, allowing the status terminal 102C and status terminal 104C to go high. When the status terminal 102C and the status terminal 104C go high, the sequencing circuit 110 and the sequencing circuit 112 initiate SLOT 3.

SLOT 3 is assigned a duration of 2 milliseconds. At the start of SLOT 3, the sequencing circuit 110 and the sequencing circuit 112 activate their respective open drain drivers to pull the status terminal 102C and status terminal 104C low. No voltage regulator is activated in SLOT 3. At the expiration of SLOT 3, the sequencing circuit 110 and the sequencing circuit 112 deactivate their respective open drain drivers to allow the status terminal 102C and status terminal 104C to go high. When the status terminal 102C and the status terminal 104C go high, the sequencing circuit 110 and the sequencing circuit 112 initiate SLOT 4.

SLOT 4 is assigned a duration of 2 milliseconds. At the start of SLOT 4, the sequencing circuit 110 and the sequencing circuit 112 activate their respective open drain drivers to pull the status terminal 102C and status terminal 104C low. A second voltage regulator of the voltage regulators 108 and a second voltage regulator of the voltage regulators 114 are enabled in SLOT 4. The power supply voltage (VREG4) generated by the voltage regulators 114 increases to a predetermined voltage within the 2-millisecond slot duration, and the at the end of the 2-millisecond slot duration, the sequencing circuit 112 deactivates its open drain driver. The power supply voltage (VREG 2) generated by the voltage regulators 108 rises slowly and reaches a predetermined voltage after more than 2 milliseconds. While VREG2 is less than the predetermined voltage, the open drain driver of the sequencing circuit 110 remains active to pull the voltage at the status terminal 102C and the status terminal 104C low. When VREG2 reaches the predetermined voltage before the timeout has expired, the sequencing circuit 110 deactivates its open drain driver allowing the voltage at the status terminal 102C and the status terminal 104C to go high. Thus, slot 4 is extended beyond the assigned duration by the slow rise time of VREG2. When the status terminal 102C and the status terminal 104C go high, the sequencing circuit 110 and the sequencing circuit 112 initiate a next slot if needed.

Figure 3:
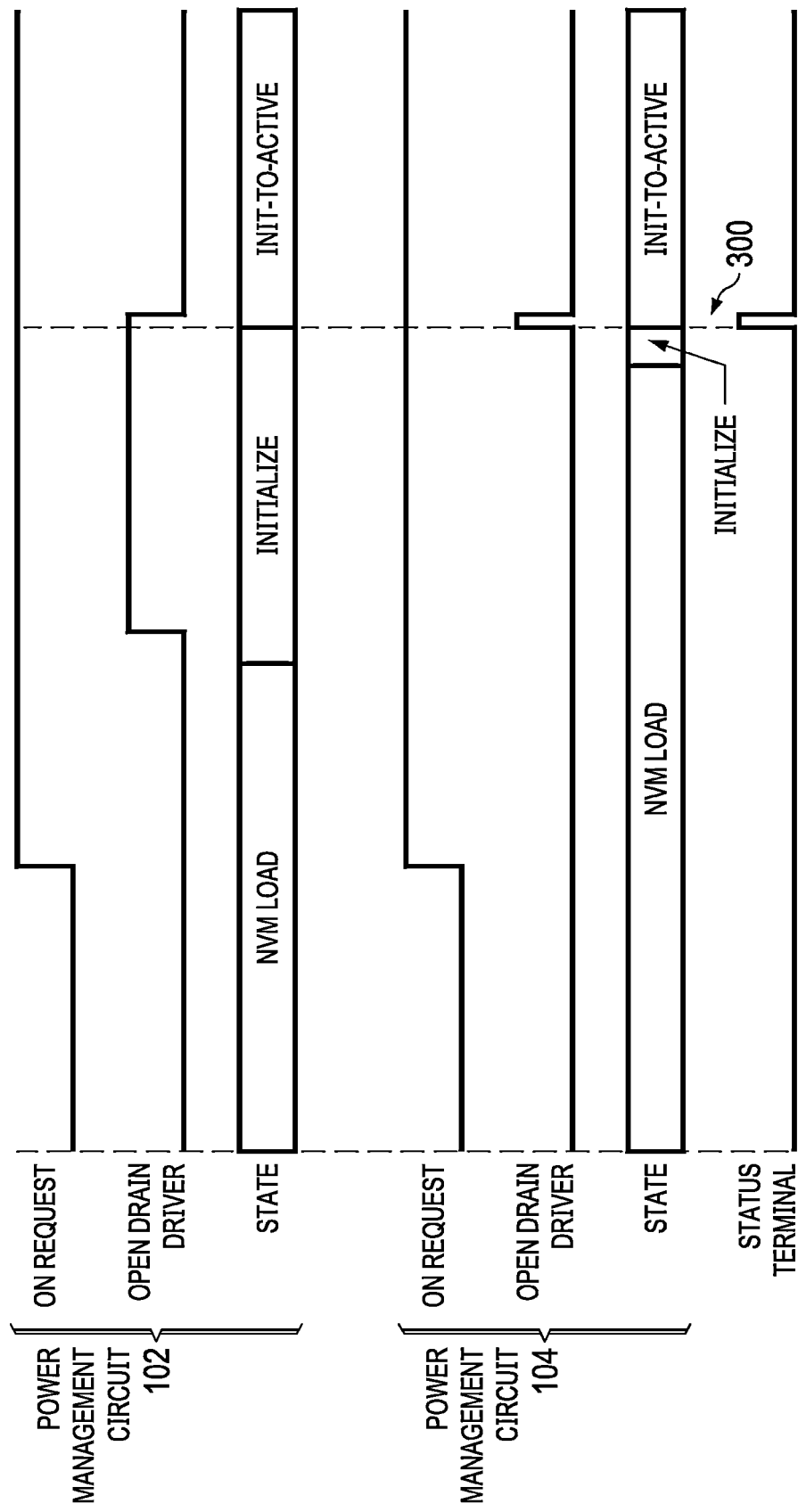
FIG. 3 shows synchronization of the start of voltage regulator sequencing in the system of FIG. 1.

FIG. 3 shows synchronization of the start of voltage regulator sequencing in the system 100. The power management circuit 102 and the power management circuit 104 may have different power up initialization times. For example, the time to transfer slot parameter information from non-volatile memory to a register bank may be different in the power management circuit 102 and the power management circuit 104. To synchronize the start of voltage regulator sequencing, the sequencing circuit 110 and the sequencing circuit 112 may activate their respective open drain drivers to pull the voltage at the status terminal 102C and the status terminal 104C low at the start of power up. The open drain driver of the sequencing circuit 110 remains active until the power management circuit 102 is initialized (e.g., the non-volatile memory is loaded to the register bank), and the open drain driver of the sequencing circuit 112 remains active until the power management circuit 104 is initialized. When both of the power management circuit 102 and the power management circuit 104 are initialized, the voltage at the status terminal 102C and the status terminal 104C goes high, and voltage regulator sequencing begins.

In FIG. 3, at time 300, initialization is complete and an on request is received in both the power management circuit 102 and the power management circuit 104. The on request is provided by device (not shown) external to the power management circuit 102 and the power management circuit 104 to initiate the power up sequence. The voltage at the status terminal 102C and the status terminal 104C goes high, and voltage regulator sequences begin in both the power management circuit 102 and the power management circuit 104.

Figure 4:
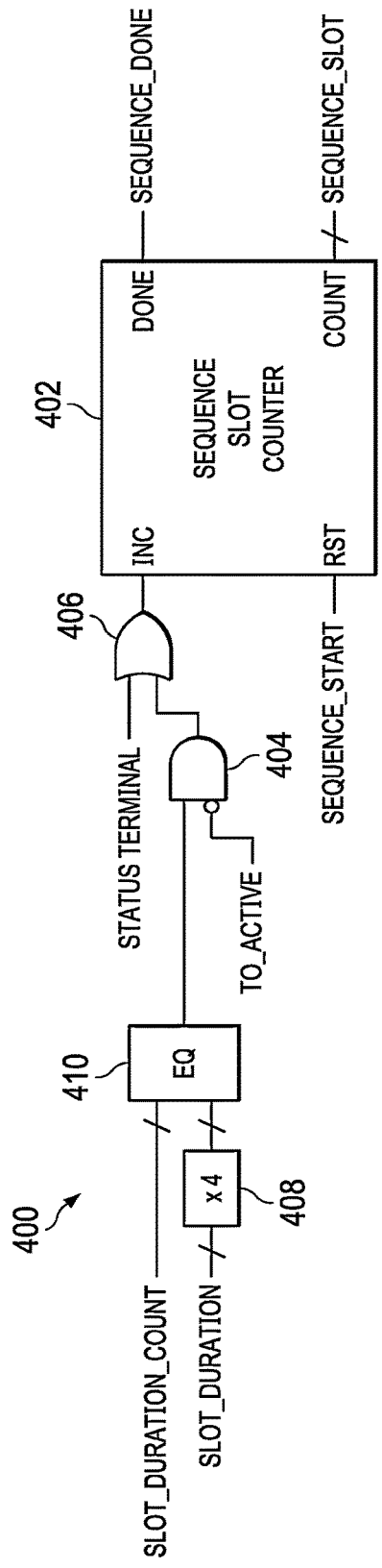
FIG. 4 is a block diagram for an example sequence slot counter circuit included in regulator sequencing circuitry of a power management circuit.

FIG. 4 is a block diagram for an example sequence slot counter circuit 400 included in sequencing circuit 110 and the sequencing circuit 112. The sequence slot counter circuit 400 includes a sequence slot counter 402, a logic gate 404, a logic gate 406, a multiplier 408, and a comparator 410. The sequence slot counter 402 may be implemented as a binary counter configured to count to a predetermined terminal count value corresponding to the number of voltage regulator slots. A count output of the sequence slot counter 402 provides a sequence slot value (SEQUENCE_SLOT) identifying a current sequence slot. A done output of the sequence slot counter 402 provides a sequence done signal (SEQUENCE_DONE) that identifies completion of voltage regulator sequencing (e.g., all sequence slots are complete). The sequence slot counter 402 is enabled to count the sequence slots by a sequence start signal received at a reset input of the sequence slot counter 402. The sequence slot counter 402 is incremented by a next slot signal received from the logic gate 406 at an increment input of the sequence slot counter 402.

An output of the logic gate 406 is coupled to the increment input of the sequence slot counter 402. A first input of the logic gate 406 is coupled to the status terminal 102C. A second input of the logic gate 406 is coupled to an output of the logic gate 404. The logic gate 406 may activate the next slot signal to increment the sequence slot counter 402 responsive to voltage at the status terminal 102C going high (e.g., at the end of the current slot), or responsive to the output of the logic gate 404 going high.

The output of the logic gate 404 goes high to indicate that during a sequence slot, time corresponding to a multiple of the slot duration has expired (a power down sequence slot has timed out). A first input of the logic gate 404 receives a signal indicating the device is in the power-up sequence (TO_ACTIVE is high to indicate power up sequence, or low to indicate power-down sequence). A second input of the logic gate 404 is coupled to an output of the comparator 410 for reception of a timeout signal.

The multiplier 408 receives a slot duration value for the current slot from non-volatile memory or a register bank storing the slot duration value read from non-volatile memory. The multiplier 408 multiplies the slot duration value by a predetermined value (e.g., 4) to produce the timeout duration. The multiplier 408 may include a shifter to perform the multiplication.

The comparator 410 is coupled to the multiplier 408 for reception of the timeout duration. The comparator 410 compares the timeout duration to a slot duration count value to determine whether the slot duration is equal to the timeout duration. When the slot duration is equal to the timeout duration during the power down sequence, the output of the comparator 410 triggers the sequence slot counter 402 via the logic gate 404 and the logic gate 406 to increment the sequence slot counter 402. The sequence slot counter 402 is incremented responsive to a timeout while powering down to allow the power down sequence to continue.

Figure 5:
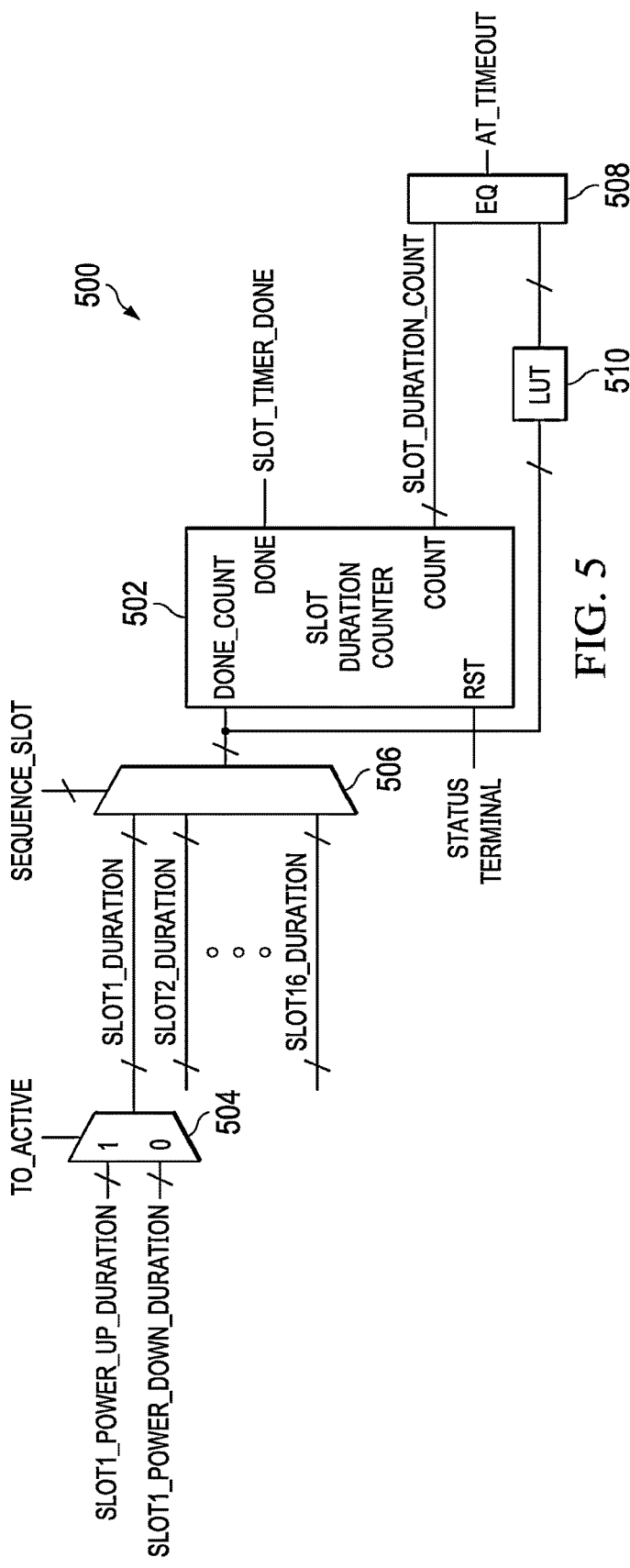
FIG. 5 is a block diagram for an example slot duration counter circuit included in regulator sequencing circuitry of a power management circuit.

FIG. 5 is a block diagram for an example slot duration counter circuit 500 included in the sequencing circuit 110 and the sequencing circuit 112. The slot duration counter circuit 500 includes a slot duration counter 502, a multiplexer 504, a multiplexer 506, a comparator 508, and a look up table circuit 510. The slot duration counter 502 times the duration of each slot, where the duration of each slot is assigned by a value read from the non-volatile memory. The slot duration counter 502 provides a slot duration count value (SLOT_DURATION_COUNT) at a count output, and provides a slot timer done signal (SLOT_TIMER_DONE) at a done output. The slot duration count value represents the active time of the current slot. The count output is coupled to an input of the comparator 410. The slot timer done signal indicates that the current slot duration is complete. A reset input of the slot duration counter 502 is coupled to the status terminal 102C to enable the slot duration counter 502 when the voltage at the status terminal 102C is low. A done count input of the slot duration counter 502 is coupled to an output of the multiplexer 506 for receipt of a slot duration value. The slot duration counter 502 may compare the slot duration value to the slot duration count value to determine whether the slot duration is complete.

The multiplexer 506 selects a slot duration value for a current slot from the slot duration values for each slot read from non-volatile memory. The sequence slot value generated by the sequence slot counter 402 is applied by the multiplexer 506 to select the slot duration value for the slot duration counter 502. A select input of the multiplexer 506 is coupled to the count output of the sequence slot counter 402 for receipt of the sequence slot value. The multiplexer 506 is illustrated as including 16 slot duration inputs. Implementations of the multiplexer 506 may include as many slot duration inputs as needed to accommodate the number of sequence slots assigned to voltage regulator sequencing.

The slot duration inputs of the multiplexer 506 are coupled to outputs of the multiplexer 504. The multiplexer 504 includes multiple multiplexers that select from a slot power up duration and a slot power down duration for each sequence slot. The slot power up duration and slot power down duration may be read from a register bank coupled to the non-volatile memory. A select input of the multiplexer 504 receives the power up sequence signal, indicating that a power down sequence is active, for controlling selection of the slot power up duration or slot power down duration values for use by the slot duration counter 502.

The look up table circuit 510 selects a timeout value based on the current slot duration for provision to the comparator 508. The comparator 508 includes a first input coupled to the output of the look up table circuit 510, and a second input coupled to the count output of the slot duration counter 502. The comparator 508 compares the output value received from the look up table circuit 510 to the slot duration count value generated by the slot duration counter 502. The comparator 508 generates a timeout signal (AT_TIMEOUT) when the slot duration count value is equal to the output of the look up table circuit 510.

Figure 6:
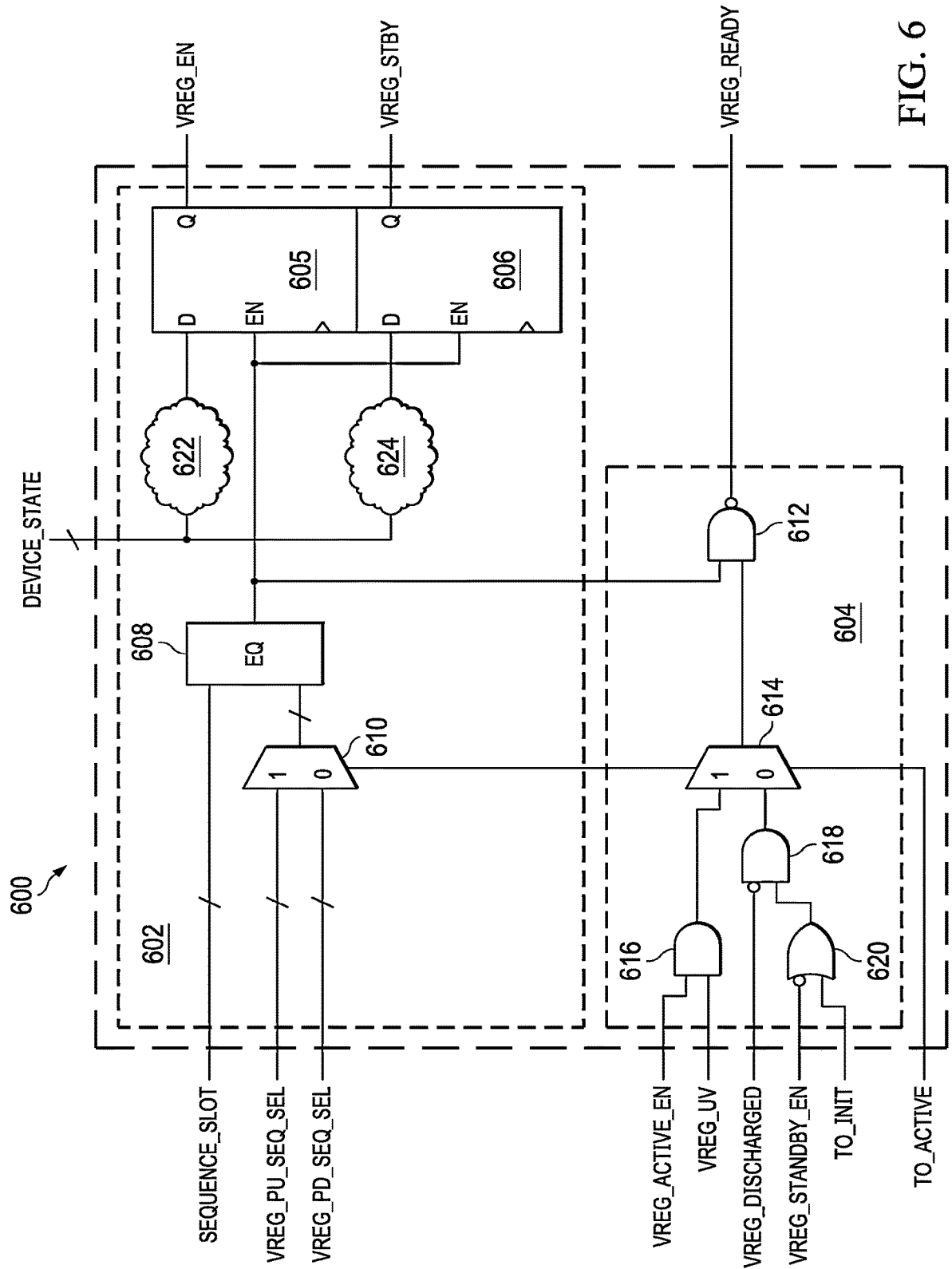
FIG. 6 is a block diagram for an example regulator control circuit included in regulator sequencing circuitry of a power management circuit.

FIG. 6 is a block diagram for an example voltage regulator control circuit 600 included in the sequencing circuit 110 and the sequencing circuit 112. An instance of the voltage regulator control circuit 600 may be provided for each voltage regulator of the voltage regulators 108 and the voltage regulators 114. The voltage regulator control circuit 600 includes control circuitry 602 and status circuitry 604. The control circuitry 602 includes a flip-flop 605, a flip-flop 606, a comparator 608, and a multiplexer 610. The multiplexer 610 selects a power up sequence slot value or a power down sequence slot value based on a signal indicating if the current sequence is a power up sequence. The power up sequence slot value and the power down sequence slot value are stored in and retrieved from the non-volatile memory. A first and second inputs of the multiplexer 610 may be coupled to a register bank that stores the power up sequence slot value and the power down sequence slot value retrieved from the non-volatile memory. The output of the multiplexer 610 identifies the sequence slot in which the voltage regulator controlled by the voltage regulator control circuit 600 is to be powered up or down. The output of the multiplexer 610 is coupled to the comparator 608.

The comparator 608 compares the sequence slot value received from the multiplexer 610 to the sequence slot value received from the sequence slot counter 402. A first input of the comparator 608 is coupled to the output of the multiplexer 610, and a second input of the comparator 608 is coupled to the count output of the sequence slot counter 402. The output of the comparator 608 is coupled to an enable input of the flip-flop 605 and an enable input of the flip-flop 606.

When the output of the comparator 608 indicates that the sequence slot value received from the sequence slot counter 402 is equal to the sequence slot value assigned for power up or power down of the voltage regulator, the flip-flop 605 enables the voltage regulator power up or power down based on state signals (power up/down) received from a state machine (not shown) of the power management circuit 102. Similarly, when the output of the comparator 608 indicates that the sequence slot value received from the sequence slot counter 402 is equal to the sequence slot value assigned for power up or power down of the voltage regulator, the flip-flop 606 enables or disables the voltage regulator in the device STANDBY state (a low power state) based on state signals (power up/down) received from a state machine (not shown) of the power management circuit 102.

The decoding logic 622 and 624 decode the device state signals to set the enable and standby state for the voltage regulator. If the device state is a sequence to active, then VREG_EN is set to a logic one, and VREG_STBY is set to a logic zero. If the device state is a sequence to standby, then VREG_EN is set to a logic one, and VREG_STBY is set to a logic one. If the device state is a sequence to off, then VREG_EN is set to a logic zero, and VREG_STBY is set to a logic zero.

The status circuitry 604 generates a status signal (VREG_READY) that indicates whether the power supply voltage generated by the voltage regulator is at a desired voltage (e.g., a desired power up or power down voltage). When not in the voltage regulator's assigned sequence slot, VREG_READY is high. When in the voltage regulator's assigned slot, VREG_READY is low until the power supply voltage generated by the voltage regulator reaches the desired voltage for power up or power down. The status circuitry 604 includes a logic gate 612, a multiplexer 614, a logic gate 616, a logic gate 618, and a logic gate 620. The multiplexer 614 selects, based on whether the current sequence is powering up or powering down, power up status generated by the logic gate 616 or power down status generated by the logic gate 618 and the logic gate 620. A first input of the multiplexer 614 is coupled to the output of the logic gate 616 for receipt of power up status. A second input of the multiplexer 614 is coupled to the output of the logic gate 618 for receipt of power down status. A select input of the multiplexer 614 receives a signal indicating whether the current sequence is a power up sequence for selecting power up or power down status.

The logic gate 616 generates a power up status signal based on the power supply voltage produced by the voltage regulator exceeding a threshold and the voltage regulator being active. A first input of the logic gate 616 is coupled to the register bank for receipt of a signal indicating whether the voltage regulator is active. A second input of the logic gate 616 is coupled to a voltage monitoring circuit for receipt of a signal indicating whether the power supply voltage generated by the voltage regulator exceeds a threshold.

The logic gate 620 generates a signal indicating whether the voltage regulator discharge should be used to gate the current sequence slot. A first input of the logic gate 620 is coupled to the register bank for receipt of signal indicating whether the voltage regulator is enabled in the device STANDBY state. A second input of the logic gate 620 receives a signal indicating that the current sequence is a power down sequence. The output of the logic gate 620 is coupled to a first input of the logic gate 618.

The logic gate 618 generates a signal indicating whether the power supply voltage produced by the voltage regulator is below a threshold. A second input of the logic gate 618 is coupled to a voltage monitoring circuit for receipt of a signal indicating whether the power supply voltage generated by the voltage regulator is below a threshold. The output of the logic gate 618 is coupled to the second input of the multiplexer 614.

The logic gate 612 produces a voltage regulator ready signal that indicates whether the power supply voltage generated by the voltage regulator is at a desired level during the assigned sequence slot. A first input of the logic gate 612 is coupled to the output of the comparator 608 for identification of the assigned sequence slot. The status signal received at the second input of the logic gate 612, from the multiplexer 614, indicates whether the power supply voltage is at the desired level.

Figure 7:
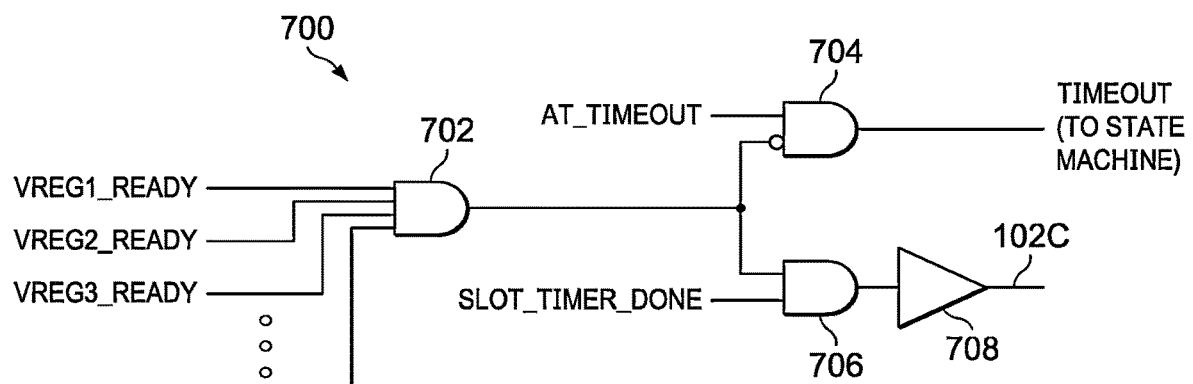
FIG. 7 is a schematic level diagram for example logic circuitry controlling an open drain driver in regulator sequencing circuitry of a power management circuit.

FIG. 7 is a schematic level diagram for example logic circuitry 700 controlling the open drain driver of the sequencing circuit 110 and the sequencing circuit 112. The logic circuitry 700 includes a logic gate 702, a logic gate 704, and a logic gate 706. The logic gate 702 is coupled to the status output of each of instance of the voltage regulator control circuit 600. Thus, the logic gate 702 is illustrated as receiving N ready signals. Each ready signal is high when the sequence slot assigned to voltage regulator corresponding to the ready signal is not equal to the current slot, and within the assigned slot, the ready signal is low until the power supply voltage output by the voltage regulator achieves a target voltage. Thus, the output of the logic gate 702 is low in each sequence slot until the voltage regulator assigned to the sequence slot generates the target power supply voltage. The output of the logic gate 702 is coupled to a first input of the logic gate 704 and a first input of the logic gate 706.

The logic gate 704 generates a power up timeout signal during power up sequencing. The second input of the logic gate 704 is coupled to the output of the comparator 508. The logic gate 704 activates the power up timeout signal when the timeout signal received from the comparator 508 is active and the output of the logic gate 702 is low (indicating the voltage regulator assigned to the sequence slot did not produce the desired voltage within the timeout interval defined by the comparator 508).

The logic gate 706 deactivates the open drain driver 708 when the output of the logic gate 702 is high and the slot duration assigned to the current sequence slot has expired. A first input of the logic gate 706 is coupled to the output of the logic gate 702. A second input of the logic gate 706 is coupled to the done output of the sequence slot counter 402. The output of the logic gate 706 is coupled to the input of the open drain driver 708. The output of the open drain driver 708 is coupled to the status terminal 102C.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A power management circuit, comprising:
    a slot parameter memory;
    a slot duration counter having a duration counter output and first and second duration counter inputs, wherein the duration counter output is configured to be coupled to a driver; and
    a multiplexer having a slot duration input, a select input, and a multiplexer output, wherein the slot duration input is coupled to the slot parameter memory, and the multiplexer output is coupled to the first duration counter input.

2. The power management circuit of claim 1, wherein the multiplexer is a first multiplexer, and the power management circuit includes a second multiplexer having first and second multiplexer inputs and a second multiplexer output, in which the first multiplexer input is coupled to the slot parameter memory, the second multiplexer input is coupled to the slot parameter memory, and the second multiplexer output is coupled to the slot duration input.

3. The power management circuit of claim 1, further comprising a sequence slot counter having a sequence counter output and a sequence counter input, wherein the sequence counter output is coupled to the select input.

4. The power management circuit of claim 3, further comprising a comparator having first and second comparator inputs and a comparator output, wherein the first comparator input is coupled to the duration counter output, the second comparator input is coupled to the multiplexer output, and the comparator output is coupled to the sequence counter input.

5. The power management circuit of claim 3, further comprising:
a voltage regulator; and
a voltage regulator control circuit having first and second control circuit inputs and a control circuit output, wherein the first control circuit input is coupled to the sequence counter output, the second control circuit input is coupled to the slot parameter memory, and the control circuit output is coupled to the voltage regulator.

6. The power management circuit of claim 5, wherein:
the duration counter output is a first duration counter output;
the control circuit output is a first control circuit output;
the slot duration counter includes:
a second duration counter output; and
the voltage regulator control circuit includes a second control circuit output; and
the power management circuit includes a logic gate having a first and second logic inputs and a logic output, wherein the first logic input is coupled to a second slot duration output, the second logic input is coupled to the second control circuit output, and the logic output is coupled to the driver.

7. A power management circuit, comprising:
a driver;
a memory configurable to store slot parameter values;
a counter coupled to the memory and the driver, and configurable to:
time a slot duration responsive to a slot duration value stored in the memory; and
deactivate the driver in response to the slot duration expiring; and
a multiplexer coupled to the counter and the memory, wherein the multiplexer is configurable to select the slot duration value from a plurality of slot duration values that are stored in the memory.

8. The power management circuit of claim 7, wherein:
the multiplexer is a first multiplexer; and
the power management circuit includes a second multiplexer coupled to the memory and the first multiplexer, and configurable to select a power up duration value or a power down duration value for each respective slot duration value of the plurality of slot duration values.

9. The power management circuit of claim 7, wherein the counter is a first counter, and the power management circuit is further comprising a second counter coupled to the multiplexer, wherein the second counter is configurable to:
increment a sequence slot value; and
control selection of the slot duration value responsive to the sequence slot value.

10. The power management circuit of claim 9, further comprising a comparator coupled to the first counter and the multiplexer, wherein the comparator is configurable to trigger the second counter to increment the sequence slot value in response to a slot duration count value exceeding a particular value.

11. The power management circuit of claim 9, further comprising:
a voltage regulator coupled to a load terminal; and
a voltage regulator control circuit coupled to the second counter, the memory, and the voltage regulator, wherein the voltage regulator control circuit is configurable to enable the voltage regulator in response to the sequence slot value being equal to a slot value.

12. The power management circuit of claim 11, wherein:
the first counter is configurable to provide a slot timer done signal;
the voltage regulator control circuit is configurable to provide a voltage regulator ready signal; and
the power management circuit includes a logic gate coupled to the first counter and the voltage regulator control circuit, wherein the logic gate is configurable to deactivate the driver in response to the slot timer done signal and the voltage regulator ready signal.

* * * * *